(12) United States Patent
Lee et al.

(10) Patent No.: US 8,364,856 B2
(45) Date of Patent: *Jan. 29, 2013

(54) MEMORY MODULE WITH CONFIGURABLE INPUT/OUTPUT PORTS

(75) Inventors: Terry R. Lee, Boise, ID (US); David Ovard, Meridian, ID (US); Roy Greeff, Boise, ID (US); Robert N. Leibowitz, Boise, ID (US); Victor Tsai, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/445,083

(22) Filed: Apr. 12, 2012

(65) Prior Publication Data

US 2012/0198201 A1 Aug. 2, 2012

Related U.S. Application Data

(63) Continuation of application No. 12/115,047, filed on May 5, 2008, now Pat. No. 8,171,181.

(51) Int. Cl.
*G06F 13/14* (2006.01)
(52) U.S. Cl. .............................. 710/12; 710/8
(58) Field of Classification Search .................. None
See application file for complete search history.

(56) References Cited

U.S. PATENT DOCUMENTS

| | | | |
|---|---|---|---|
| 6,067,318 A | 5/2000 | Bailey et al. | |
| 7,406,572 B1 | 7/2008 | Nguyen | |
| 7,610,500 B2 | 10/2009 | Cherukuri et al. | |
| 7,788,439 B1 | 8/2010 | Tsu et al. | |
| 2002/0087751 A1 | 7/2002 | Chong, Jr. | |
| 2002/0112119 A1 | 8/2002 | Halbert et al. | |
| 2005/0271078 A1 | 12/2005 | Quayle et al. | |
| 2006/0184809 A1 | 8/2006 | Kojou et al. | |
| 2007/0124532 A1 | 5/2007 | Bennett | |
| 2007/0300201 A1 | 12/2007 | Matsumoto et al. | |
| 2008/0276020 A1 | 11/2008 | Ching et al. | |
| 2009/0187680 A1 | 7/2009 | Liao et al. | |
| 2012/0030386 A1* | 2/2012 | Hofstee et al. | 710/104 |

* cited by examiner

*Primary Examiner* — Ilwoo Park
(74) *Attorney, Agent, or Firm* — Leffert Jay & Polglaze, P.A.

(57) ABSTRACT

A memory module is coupled to a number of controllers. The memory module is configured to configure each of a number of data input/output ports thereof as at least one of an input and an output in response to a first command from a particular controller of the controllers. The memory module is configured to partition itself into memory partitions in response to a second command from the particular controller so that each memory partition corresponds to a respective one of the controllers. Each of a number of data input/output ports of the controllers is configurable as at least one of an input and an output to correspond to a respective one of the input/output ports of the memory module. The first and second commands may originate from the particular controller, or the controllers may be coupled in parallel to the memory module.

32 Claims, 6 Drawing Sheets

MEMORY MODULE WITH CONFIGURABLE INPUT/OUTPUT PORTS

RELATED APPLICATION

This application is a continuation of U.S. application Ser. No. 12/115,047, titled "MEMORY MODULE WITH CONFIGURABLE INPUT/OUTPUT PORTS," filed May 5, 2008 and issued as U.S. Pat. No. 8,171,181 on May 1, 2012, which is commonly assigned and incorporated in its entirety herein by reference.

FIELD

The present disclosure relates generally to memory modules and in particular the present disclosure relates to memory modules with configurable input/output ports.

BACKGROUND

Memory modules, such as memory cards, are commonly used in electronic devices, such as personal computers, personal digital assistants (PDAs), digital cameras, digital media players, cellular telephones. For various storage applications, memory modules, such as flash memory modules, may be configured as removable memory that can be removably coupled to a host device, such as a processor of an electronic device.

A typical memory module may include one or more memory devices coupled to a memory controller. Each memory device may be a NAND or a NOR flash memory device, dynamic random access memory (DRAM) device, static random access memory (SRAM) device, or the like and may include an array of memory cells, such as non-volatile memory cells. The memory controller provides data signals, address signals, and control signals to each of the one or more memory devices.

The memory controller is usually placed in communication with a host via an input/output interface (e.g., which is often referred to as an input/output bus) for coupling to a host device to form part of an electronic system. An example of an input/output bus is a USB (Universal Serial Bus) interface.

The input/output interface typically provides one or more data signal links (often referred to as lanes), e.g., 1, 4, 8, 16, etc., over which the controller can receive data signals from the host and/or over which the controller can send data signals to the host. For example, the input/output data signal lanes may include unidirectional or bidirectional data signal lines. The number of input/output data signal lanes is often referred to as the input/output bus width of the input/output interface. However, conventional interfaces are limited in that the same input/output data signal lanes that are used for output are also typically used for input.

For the reasons stated above, and for other reasons stated below which will become apparent to those skilled in the art upon reading and understanding the present specification, there is a need in the art for alternatives for configuring data signal lines of input/output interfaces on memory modules.

DETAILED DESCRIPTION

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof.

Figure 1:
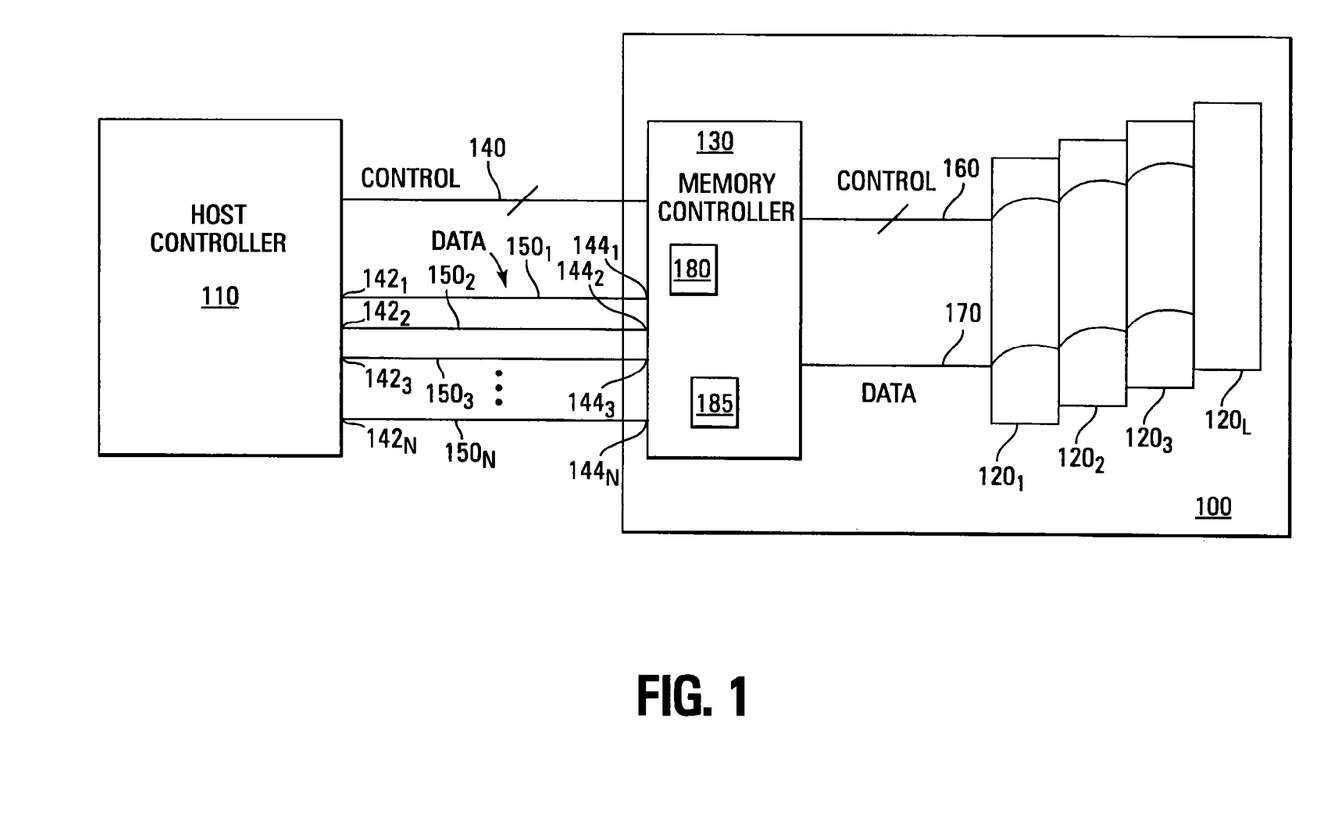
FIG. 1 is a block-diagram illustration of an embodiment of an electronic system, according to an embodiment of the disclosure.

FIG. 1 is a block-diagram illustration of a memory module 100, such as a memory card, coupled to a host controller 110, e.g., as part of an electronic system, according to an embodiment. Examples of electronic systems include such systems as computer systems, peripheral devices, cellular and wireless devices, digital cameras, audio recorders, personal digital assistants (PDAs), etc.

For one embodiment, memory module 100 may include one or more memory devices 120, such as memory chips or dies, in communication with a memory controller 130. Examples of memory devices include NAND, NOR, or other non-volatile memory devices, dynamic random access memory devices (DRAMs), static random access memory devices (SRAMs), or the like. Each memory device 120 may include an array of memory cells, such as non-volatile memory cells.

Host controller 110 provides control signals, such as command signals (commands) and address signals (addresses), to memory controller 130 over an external control signal link 140 that is external to memory module 100 and that is coupled between host controller 110 and memory controller 130. For one embodiment, memory controller 130 may send configuration signals (configuration information), e.g., indicative of its configuration and/or the configuration of memory module 100, to host controller 110 over control signal link 140. Data signals (data) may be sent from input/output ports 142 of host controller 110 to input/output ports 144 of memory controller 130 over external data links 150 (also referred to as data lanes) during write operations. Data signals may be received at input/output ports 142 of host controller 110 from input/output ports 144 of memory controller 130 over data links 150 during read operations.

Memory controller 130 provides address signals and/or command signals, e.g., in response to commands and/or addresses received from host controller 110, to one or more of the memory devices 120 over an internal control link 160 that is internal to memory module 100. Memory controller 130 also sends data received from host controller 110, during the write operations, to one or more of the memory devices 120 over an internal data link 170 that is internal to memory module 100. Memory controller 130 also receives data, during the read operations, from one or more of the memory devices 120 over data link 170 for subsequent transmission to host controller 110. For one embodiment, data link 170 may be a data bus having a bus width of 1, 2, 4, 8, 16, 32, or 64 bits, etc.

For one embodiment, a first number of data links 150 may be unidirectional and may be configured to convey data in a first direction, e.g., from host controller 110 to memory controller 130, e.g., during a write operation. Configuring the input/output ports 142 of host controller 110 coupled to the first number of data links 150 as outputs and configuring the input/output ports 144 of memory controller 130 coupled to respective ones of the input/output ports 142 by the first number of data links 150 as inputs may accomplish this. A second (e.g., remaining) number of data links 150 may be unidirectional and be configured to convey data in a second direction opposite the first direction, e.g., from memory controller 130 to host controller 110, e.g., during a read operation. Configuring the input/output ports 142 of host controller 110 coupled to the second number of data links 150 as inputs and configuring the input/output ports 144 of memory controller 130 coupled to respective ones of the input/output ports 142 by the second number of data links 150 as output ports may accomplish this.

In one example, for N=4 in FIG. 1, i.e., for four data links 150, input/output ports $142_1$-$142_3$ respectively coupled to data links $150_1$-$150_3$ may be configured as output ports and input/output ports $144_1$-$144_3$ respectively coupled to data links $150_1$-$150_3$ may be configured as input ports, while input/output port $142_4$ coupled to data link $150_4$ may be configured as an input port and input/output port $144_4$ coupled to data link $150_4$ may be configured as an output port. This configures data links $150_1$-$150_3$ to convey data from host controller 110 to memory controller 130 and data link $150_4$ to convey data from memory controller 130 to host controller 110. In another example, data links $150_1$-$150_2$ may be configured to convey data from host controller 110 to memory controller 130, and data links $150_3$-$150_4$ may be configured to convey data from memory controller 130 to host controller 110. For one embodiment, the read and write operations may occur concurrently so that data is concurrently conveyed from host controller 110 to memory controller 130 over a first number of data links 150 and from memory controller 130 to host controller 110 over a number portion of data links 150.

For another embodiment, all of the data links 150 may be configured to convey data in a first direction, e.g., from host controller 110 to memory controller 130, whereas a number (e.g., a fraction) of all of the data links 150 may be configured to convey data in a second direction opposite the first direction, e.g., from memory controller 130 to host controller 110. For example, when the data is being conveyed in the first direction, all of the input/output ports 142 of host controller 110 are configured as outputs and all of the input/output ports 144 of memory controller 130 are configured as inputs, and when the data is conveyed in the second direction, a number of all of the input/output ports 142 of host controller 110 coupled to the portion of all of the data links 150 are configured as input ports and a portion all of the input/output ports 144 of memory controller 130 coupled to the portion of all of the data links 150 are configured as output ports. Alternatively, all of the data links 150 may be configured to convey data from memory controller 130 to host controller 110, whereas a number (e.g., a fraction) of all of the data links 150 may be configured to convey data from host controller 110 to memory controller 130.

For another embodiment, one or more of data links 150 may be configured as bidirectional data links. Configuring one or more input/output ports 142 of host controller 110 as bidirectional input/outputs and configuring one or more input/output ports 144 of memory controller 130 respectively coupled to the one or more input/output ports 142 by data links 150 as bidirectional input/outputs (i.e., both an input and an output) may accomplish this. For one embodiment, data may be conveyed from host controller 110 to memory controller 130 over a first number of the bidirectional data links and data may be conveyed from memory controller to host controller 110 to over a second number of the bidirectional data links concurrently.

For one embodiment, the configuration of data links 150 may be stored, e.g., as configuration data, in a register 180, e.g., of memory controller 130, e.g., during manufacture of memory module 100. Then, upon start up of memory module 100, for example, memory controller 130 reads register 180 and configures data links 150 according to the configuration stored in register 180 by configuring input/output ports 144 accordingly, e.g., as input ports for data writes from host controller 110 and/or output ports for data reads to host controller 110. For example, register 180 may contain a bit for each input/output port 144 indicating its configuration, i.e., configured as input or configured as output.

For another embodiment, memory controller 130 may send a signal to host controller 110 indicating the configuration of input/output ports 144 so that host controller 110 can configure input/output ports 142 to correspond to the configuration of input/output ports 144. For example, for data writes from host controller 110 to memory controller 130, host controller 110 may configure the input/output ports 142 coupled to input/output ports 144 that are configured as input ports as output ports, while for data reads from memory controller 130 to host controller 110, host controller 110 may configure the input/output ports 142 coupled to input/output ports 144 that are configured as output ports as input ports.

For one embodiment, data links 150 may be configured according to operational attributes of memory module 100, such as the power consumption per input/output port 144, power supplied to memory module 100, the number of times memory devices 120 have been programmed and/or read, the data rate capacity per input/output port 144, etc. For example, host controller 110 may send a command to memory controller 130 indicating that data should be conveyed at a certain rate between host controller 110 and memory controller 130. Based on the desired rate, the memory controller 130 may configure its input/output ports 144 to attain the desired rate. Alternatively, memory controller 130 may send its attributes to host controller 110 in response to the command, and host controller 110 may determine the number of data links 150 to be configured for conveying the data based on the attributes of memory module 100. In turn, host controller 110 may configure its input/output ports 142 accordingly and may instruct memory controller 130 to configure its input/output ports 144 as input ports if coupled to an input/output port 142 configured as an output port and to configure its input/output ports 144 as output ports if coupled to an input/output port 142 configured as an input port. For one embodiment, the attributes of memory module 100 may be stored in a register, such as register 180 of memory controller 130.

For another embodiment, data links 150 may be configured "on the fly," e.g., in response to commands from host controller 110. For example, host controller 110 may send a command to memory controller 130 indicating that data should be conveyed between host controller 110 and memory controller 130 at a certain overall data rate. Memory controller 130 may then determine how many data links 150 to use convey the data between host controller 110 and memory controller 130 based on that rate. The number of data links 150 may be determined from the overall data rate and an attribute of memory module 100, such as the data rate per link, power consumption per link, power supplied to memory module 100, etc. For example, memory controller 130 may have a look-up table 185 that outputs a number of data links 150 to be used to convey the data in response to inputting the overall data rate. Memory controller 130 may then configure its input/output ports 144 accordingly and send an indication of the configuration of input/output ports 144 to host controller 110 so that host controller 110 can configure its input/output ports 142 to correspond to the configuration input/output ports 144, e.g. so that input/output ports 142 that are configured as output ports are coupled to input/output ports 144 that are configured as input ports or vice versa.

For another embodiment, memory controller 130 may send one or more attributes of memory module 100 to host controller 110, e.g., in response to host controller 110's command indicating that data should be conveyed between the memory controller 130 and host controller 110 at a certain rate. Host controller 110 may then determine, from the one or more attributes of memory module 100 received from memory controller 130, the number of data links 150 that may be needed to convey the data between host controller 110 and memory controller 130 at the certain rate. Host controller 110 may then configure that number of data links 150 by accordingly configuring that number of its input/outputs 142 for input or output and by instructing memory controller 130 to accordingly configure that number of its input/outputs 144 for input or output so that input/outputs 142 configured for output are coupled input/outputs 144 configured for input or vice versa.

For certain situations, the data rate for a read operation, where data is conveyed from memory controller 130 to host controller 110, may be less than the data rate for a write operation, where data is conveyed from host controller 110 to memory controller 130 or vice versa. Therefore, a larger number of data links 150 may be used for the write operation than the read operation or vice versa.

For one embodiment, the number of data links 150 to be used to convey data to or from memory controller 130 may depend on an attribute, such as the power requirements of each line of memory module 100. For one example, the memory module 100 could operate at multiple power consumption levels by limiting the number of data links 150 to be used for convey data. Thus, the memory module 100 could configure its input/output ports 144 to maintain the power consumption below some desired level. Because power consumption will generally differ between when an input/output port 144 is used for data input and when it is used for data output, the number of input/output ports 144 designated for input need not be the same as the number designated for output. For one embodiment, power consumption information, such as the power consumption per data link 150, may be stored in a register, such as register 180 of memory controller 130, e.g., during manufacture of memory module 100.

For one embodiment, memory controller 130 may be configured to configure data links 150 in response to an attribute, such as the power supplied to memory module 100. For example, when memory module 100 is operating in a first power mode, e.g., memory module 100 is powered by a high-power source, such as a public power grid, a larger number of data links may be used to convey data between host controller 110 and memory controller 130 than when memory module 100 is operating in a second power mode, e.g., memory module 100 is powered by a low-power source, such as a battery. For example, all of data links 150 may be used for conveying data when memory module 100 is powered by the high-power source and less than all of data links 150 may be used for conveying data when memory module 100 is powered by the low-power source.

For one embodiment, when memory module 100 is powered by the high-power source, memory controller 130 may configure all of its input/output ports 144 as inputs or outputs and may subsequently send a signal to host controller 110, indicating the configuration of input/output ports 144. Host controller 110 may then configure all its input/output ports 142 for input or output in response to the signal so that the input/output ports 142 configured for output are respectively coupled to the input/output ports 144 configured for input or vice versa.

When memory module 100 is powered by the low-power source, memory controller 130 may configure less than all of its input/output ports 144 as input or output ports and prevent the use of (e.g., disable) the remaining input/output ports 144. Memory controller 130 may then send a signal to host controller 110, indicating the configuration of input/output ports 144. Host controller 110 may then configure less than all of its input/output ports 142 (e.g., the same number input/output ports 142 and 144 will be configured) for input or output in response to the signal so that the input/output ports 142 configured for output are respectively coupled to the input/output ports 144 configured for input or vice versa. Note that host controller 110 may prevent the use of (e.g., disable) the remaining input/output ports 142 that are respectively coupled to the disabled input/output ports 144.

For one embodiment, the number of data links 150, used for conveying data from host controller 110 to memory controller 130, may be based on the relative number of programming operations and read operations that have been performed on memory devices 120. Therefore, memory controller 130 may keep track of the number of programming and read operations, and configure its input/output ports 144 so that the number of ports configured as inputs is proportional to the number of write operations and the number of ports configured as outputs is proportional to the number of read operations.

Figure 2:
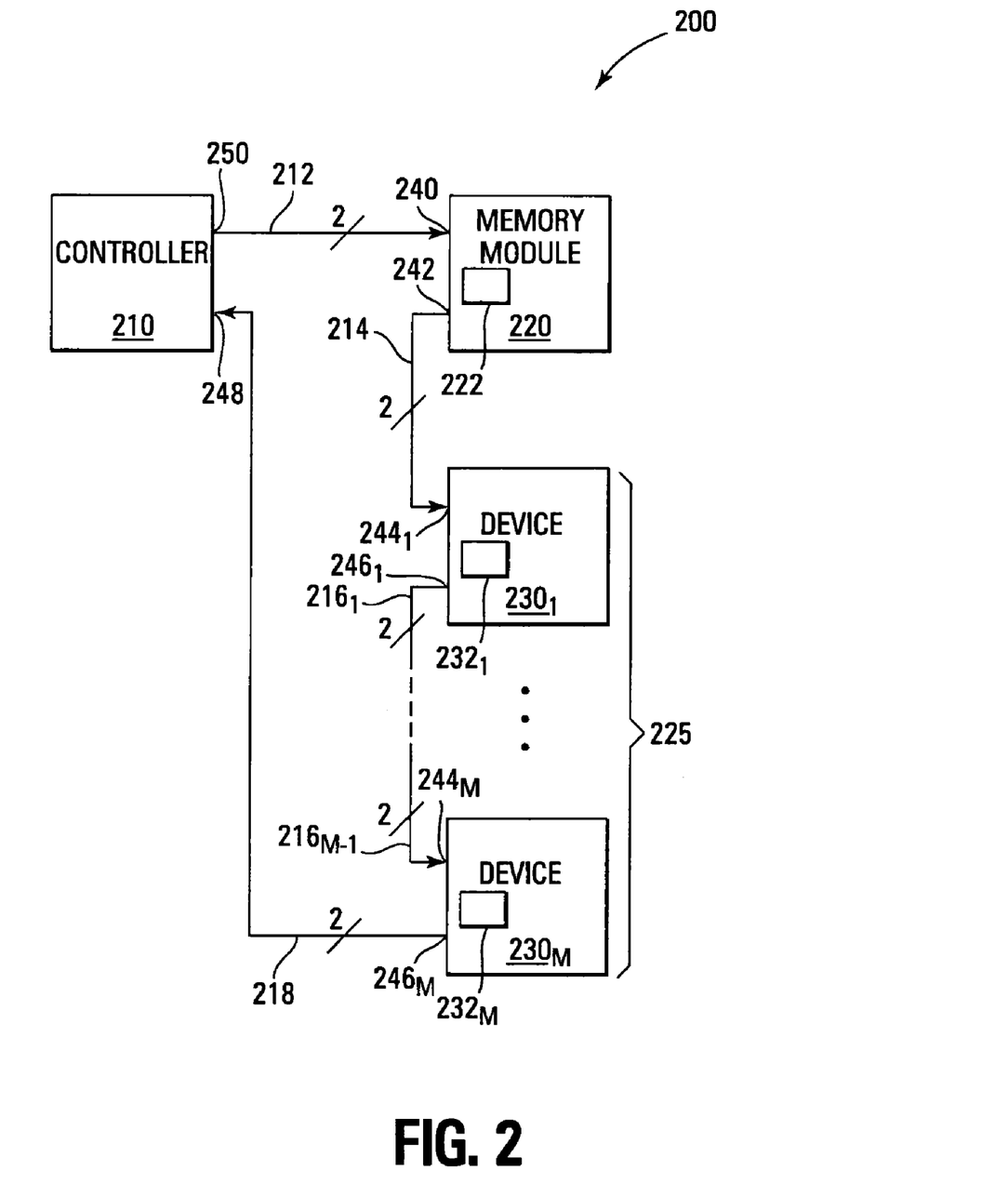
FIG. 2 is a block-diagram illustration of an embodiment of an electronic system configured as a ring, according to another embodiment of the disclosure.

FIG. 2 is a block diagram illustration of an electronic system 200 configured as a ring network, according to another embodiment. For one embodiment, ring network 200 includes a controller 210, such as a host controller, coupled serially, point-to-point, by a unidirectional data link 212, to a memory module 220 that may be substantially similar to the memory module 100 described above. For one embodiment, memory module 220 is coupled serially, point-to-point, to a first device (device $230_1$) of a string 225 of devices 230 by a unidirectional data link 214. The devices 230 are serially coupled, point-to-point, to each other by unidirectional data links 216 to form string 225. A last device (device $230_M$) of string 225 is serially coupled, point-to-point, to controller 210 by a data link 218 to complete ring network 200. Although the present example illustrates each data link as having two lines, each data link may have one or more lines. For one embodiment, each of devices 230 may be a memory module similar to memory module 220, a hard drive, a camera, a slave controller, etc.

For another embodiment, memory module 220 includes a controller 222, e.g., similar to memory controller 130 described above, and each of devices 230 includes a controller 232, e.g., similar to memory controller 130. For example, controller 222 of memory module 220 is configured to configure input/output ports 240 of memory module 220 as inputs and input/output ports 242 of memory module 220 as outputs. The controller 232 of each of devices 230 is configured to configure input/output ports 244 of that device as inputs and input/output ports 246 of that device as outputs. Controller 210 is configured so that its input/output ports 248 are configured as inputs and its input/output ports 250 are configured as outputs.

For one embodiment, memory module 220 and devices 230 are configured to operate in a pass-through mode, so that data can be passed around ring 200. For another embodiment, when memory module 220 is coupled to controller 210, controller 210 may send a signal to controller 222 that instructs controller 222 to configure the input/output ports of memory module 220 in a certain way. In addition, the signal may be sent to the controllers 232 of devices 230 for instructing controllers 232 to configure the input/output ports of the respective devices 230 in a certain way.

Controller 222 of memory module 220 may also be configured to determine whether data received thereat from host controller 210 is intended for memory module 220 and should be acted on by controller 222 or that the data is not intended for memory module 220 and should be passed on to device $230_1$. The controller 232 of each device 230 may be configured to determine whether data received thereat is intended for that device 230 and should be acted on by that controller 232 or that the data is not intended for that device 230 and should be passed on to another device 230 or to controller 210 in the case of device $230_M$.

For one embodiment, all of the data sent by controller 210 is passed around ring 200 and is received at memory module 220 and each of devices 230. If controller 222 of memory module 220 determines that the data is intended for memory module 220, then controller 222 acts on the data and/or if a controller 232 a device 230 determines that the data is intended for that device 230, then that controller 232 acts on the data.

Figure 3:
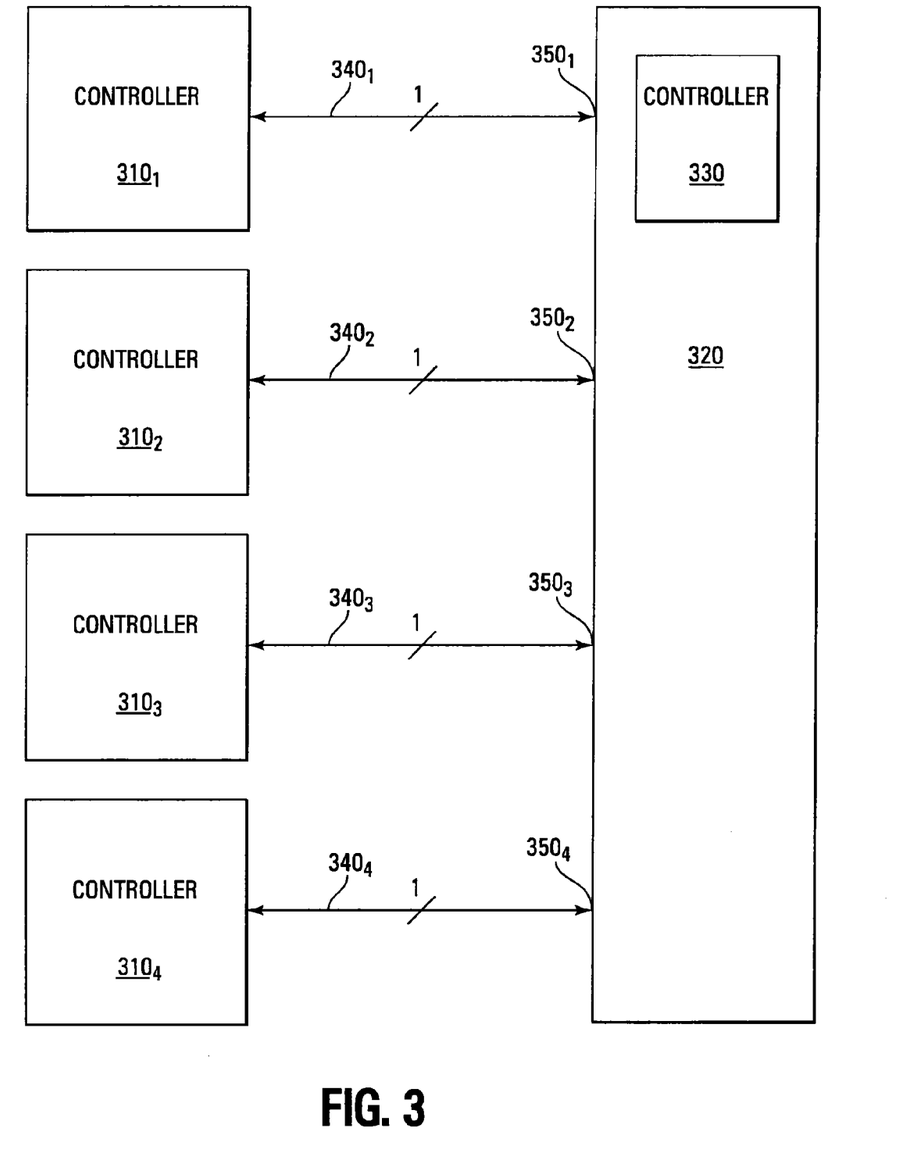
FIG. 3 is a block-diagram illustration of another embodiment of an electronic system, according to another embodiment of the disclosure.
Figure 4:
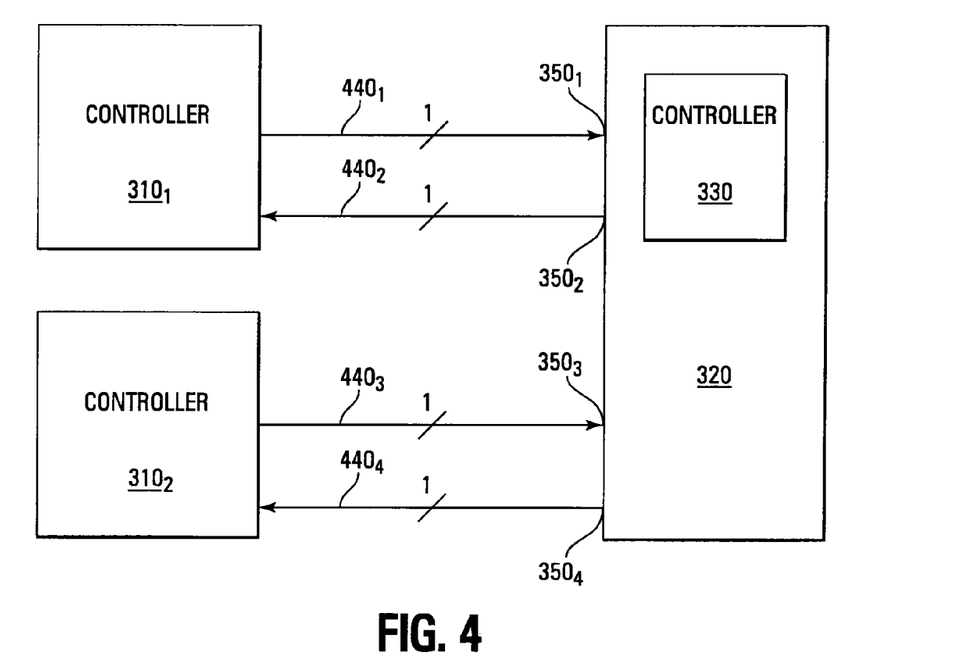
FIG. 4 is a block-diagram illustration of another embodiment of an electronic system, according to another embodiment of the disclosure.
Figure 5:
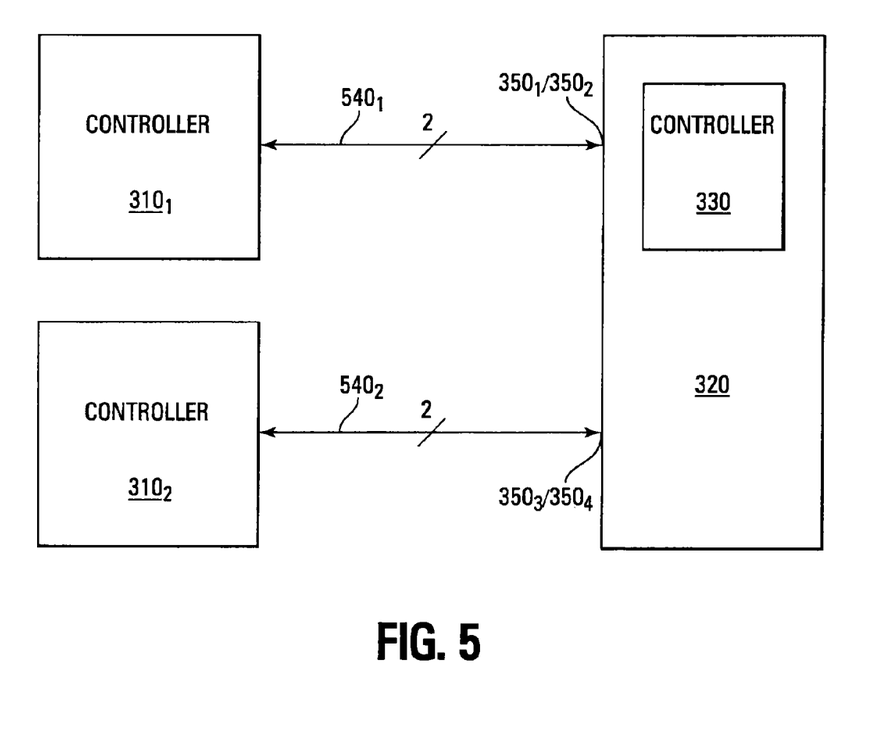
FIG. 5 is a block-diagram illustration of another embodiment of an electronic system, according to another embodiment of the disclosure.

FIGS. 3-5 provide examples of how a memory module 320 might configure a fixed number, e.g., four, of data input/output ports 350, according to other embodiments. In FIG. 3, each of input/output ports 350 is configured for bidirectional communication with a respective one of controllers 310. A bidirectional data link 340 is coupled between each input/output port 350 a respective one of controllers 310. Each of controllers 310 may be host controller similar to host controller 110, discussed above in conjunction with FIG. 1. Memory module 320 may be similar to memory module 100, discussed above in conjunction with FIG. 1. The controller 330 is configured to output data and configuration signals to a controller 310 from which the corresponding access command was received. For example, if a read request is received from controller $310_2$ on data link $340_2$, then data in response to that read request would be output to input/output port $350_2$. Similarly, if a write command is received from controller $310_3$ on data link $340_3$, then configuration signals in response to that write command would be output to input/output port $350_3$.

In FIG. 4, each of input/output ports 350 is configured for unidirectional communication. For example, input/output ports $350_1$ and $350_3$ are configured as inputs for respectively receiving data from controllers $310_1$ and $310_2$ over unidirectional data links $440_1$ and $440_3$, and input/output ports $350_2$ and $350_4$ are configured as outputs for respectively sending data to controllers $310_1$ and $310_2$ over unidirectional data links $440_2$ and $440_4$. The controller 330 is configured to output data and configuration signals to a controller 310 from which the corresponding access command was received. For example, if a read request is received from controller $310_1$ on data link $440_1$, then data in response to that read request would be output to input/output port $350_2$. Similarly, if a write command is received from controller $310_2$ on data link $440_3$, then status signals in response to that write command would be output to input/output port $350_4$.

In FIG. 5, each of input/output ports 350 is configured for bidirectional communication. For example, input/output ports $350_1$ and $350_2$ are configured for bidirectional communication with controller $310_1$ over bidirectional data links $540_1$, and input/output ports $350_3$ and $350_4$ are configured for bidirectional communication with controller $310_2$ over bidirectional data links $540_2$. The controller 330 is configured to output data and configuration signals to a controller 310 from which the corresponding access command was received. For example, if a read request is received from controller $310_1$ on data link $540_1$, then data in response to that read request would be output to data link $540_1$. Similarly, if a write command is received from controller $310_2$ on data link $540_2$, then configuration signals in response to that write command would be output to data link $540_2$.

For one embodiment, a memory controller 330 of memory module 320 configures each of input/output ports 350 according to the example configurations of FIGS. 3-5. For example, one of controllers 310, e.g., controller $310_1$, may temporarily act as a master controller that instructs memory controller 330 to configure each of input/output ports 350. Optionally, controller $310_1$ may also instruct memory controller 330 to partition memory module 320 so that each memory partition corresponds to a respective one of controllers 310. For another embodiment, memory module 320 may have registers that can be read by memory controller 330 upon power up of memory module 320 and that instruct controller 330 to configure input/output ports 350 and optionally partition memory module 320.

Figure 6:
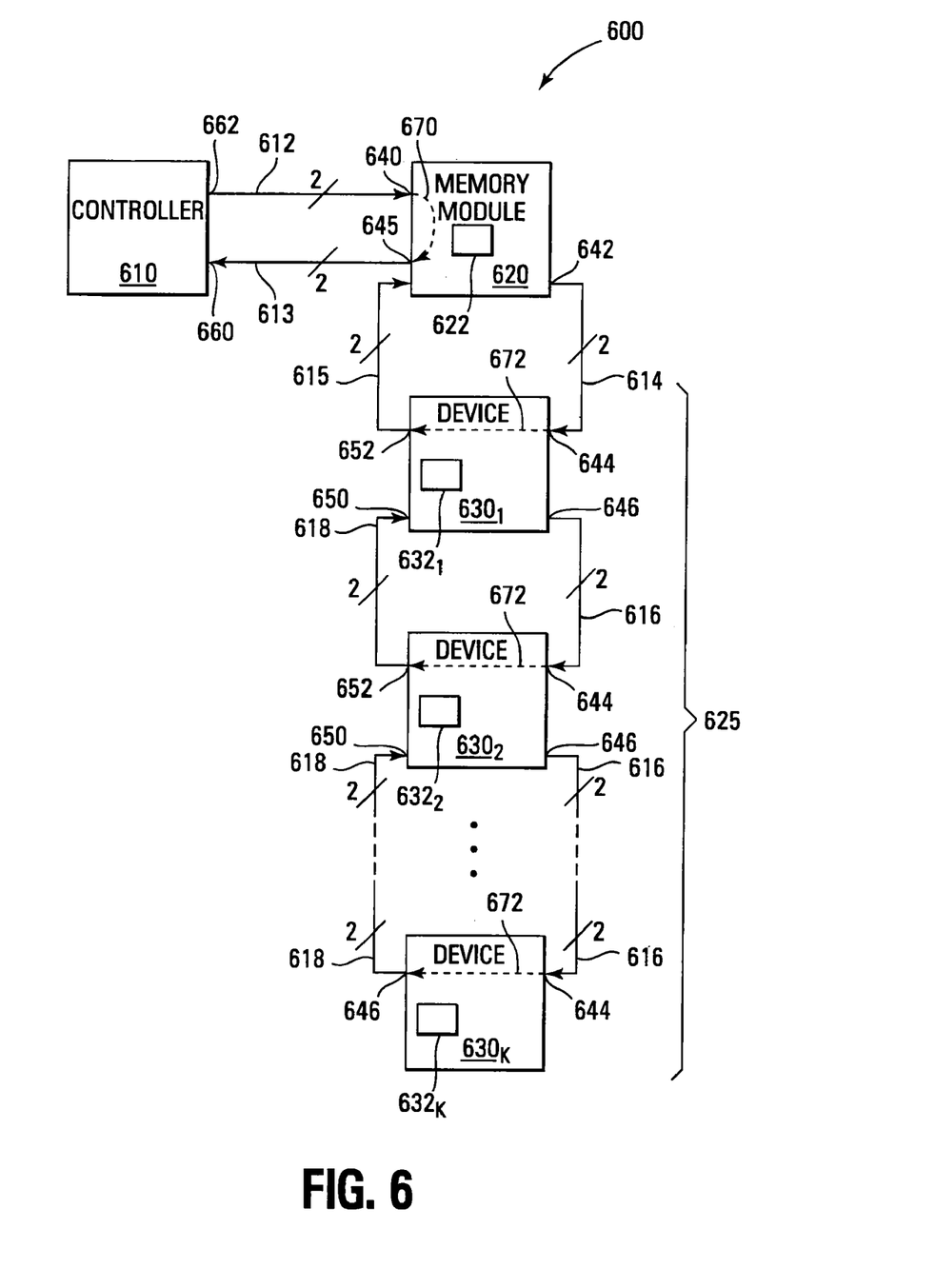
FIG. 6 is a block-diagram illustration of another embodiment of an electronic system, according to another embodiment of the disclosure.

FIG. 6 is a block diagram illustration of an electronic system 600, e.g., configured as a "chain" network. For one embodiment, electronic system 600 includes a controller 610, such as a host controller, coupled serially, point-to-point, by unidirectional data links 612 and 613, to a memory module 620 that may be substantially similar to the memory module 100 described above. For one embodiment, memory module 620 is coupled serially, point-to-point, to a first device (device $630_1$) of a string (e.g., a "chain") 625 of devices 630 by a unidirectional data link 614 and a unidirectional data link 615. The devices 630 are serially coupled, point-to-point, to each other by unidirectional data links 616 and unidirectional data links 618 to form string 625 such that each of the devices 630 forms a "link" in the "chain." Although the present example illustrates each data link as having two lines, each data link may have one or more lines. For one embodiment, each of devices 630 may be a memory module similar to memory module 620, a hard drive, a camera, a slave controller, etc.

For another embodiment, memory module 620 includes a controller 622, e.g., similar to memory controller 130 described above, and each of devices 630 includes a controller 632, e.g., similar to memory controller 130. For example, controller 622 of memory module 620 is configured to configure input/output ports 640 of memory module 620 as inputs, input/output ports 645 of memory module 620 as outputs, and input/output ports 642 of memory module 620 as outputs. The controller 632 of each of devices 630 is configured to configure input/output ports 644 of that device as inputs and input/output ports 646 of that device as outputs. The controller 632 of each of devices 630, e.g., except the last device (device $630_K$) (e.g., devices $630_1$ and $630_2$) is configured to configure input/output ports 650 of that device as inputs and input/output ports 652 of that device as outputs.

Controller 610 is configured so that its input/output ports 660 are configured as inputs and its input/output ports 662 are configured as outputs.

For one embodiment, memory module 620 and devices 630 can be configured to operate in a pass-through mode so that data can be passed from controller 610 to device $630_K$ through memory module 620 and through the successive devices 630 (e.g., devices $630_1$ and $630_2$ in succession). Data may be passed to controller 610 from device $630_K$ through the successive devices 630 (e.g., devices $630_2$ and $630_1$ in succession).

For another embodiment, data do not need to pass through subsequent devices 630 before being returned to controller 610, as indicated by dashed arrow 670 of memory module 620 and dashed arrows 672 of devices 630. For example, data received at input 640 of memory module 620 from controller 610 may be returned to controller 610 through output 645 of memory module 620 without passing through any of devices 630, as indicated by dashed arrow 670. Similarly, data received at input 644 of device $630_1$ from memory module 620 may be returned to controller 610 through output 652 of device $630_1$ by passing through memory module 620 and without passing through any of the remaining devices 630 downstream of device $630_1$ (e.g., devices $630_2$ and $630_K$), in a direction from controller 610, as indicated by dashed arrow 672 of device $630_1$. Also, data received at input 644 of device $630_2$ from device $630_1$ may be returned to controller 610 through output 652 of device $630_2$ by passing through device $630_1$ and memory module 620 and without passing through any of the remaining devices 630 downstream of device $630_2$ (e.g., device $630_K$), as indicated by dashed arrow 672 of device $630_2$.

For one embodiment, when memory module 620 is coupled to controller 610, controller 610 may send a signal to controller 622 that instructs controller 622 to configure the input/output ports of memory module 620 in a certain way. In addition, the signal may be sent to the controllers 632 of devices 630 for instructing controllers 632 to configure the input/output ports of the respective devices 630 in a certain way. For another embodiment, a device 630 (e.g., device $630_1$) located upstream (e.g., in a direction toward controller 110) of a downstream device 630 (e.g., device $630_2$) may configure the downstream device 630 in a certain way or vice versa, e.g., downstream device $630_2$ may configure upstream device $630_1$.

Controller 622 of memory module 620 may also be configured to determine whether data received thereat from host controller 610 and intended for memory module 620 and should be acted on by controller 622 or that data is not intended for memory module 620 and should be passed on to device $630_1$. The controller 632 of each device 630 may be configured to determine whether data received thereat is intended for that device 630 and should be acted on by that controller 632 or that the data is not intended for that device 630 and should be passed on to another device 630 or to controller 610.

For one embodiment, all of the data sent by controller 610 can be passed along the chain and can be received at memory module 620 and each of devices 630. If controller 622 of memory module 620 determines that the data is intended for memory module 620, then controller 622 acts on the data and/or if a controller 632 of a device 630 determines that the data is intended for that device 630, then that controller 632 acts on the data.

For another embodiment, memory module 620 and each of devices 630 can perform different operations concurrently. For example, memory module 620 or a device 630 can receive and act on data moving in a direction (e.g., downstream) from controller 610 and can independently and concurrently receive and act on data moving in an opposite direction (e.g., upstream) toward controller 610. For another embodiment, the memory module 620 and each of devices 630 may be configured to operate at different rates.

Conclusion

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. A memory module, comprising:
   one or more memory devices;
   a memory-module controller in communication with the one or more memory devices; and
   a plurality of input/output ports;
   wherein the memory-module controller is configured to configure each of the input/output ports of the memory module as at least one of an input and an output in response to a first command from a particular host controller of a plurality of host controllers coupled in parallel to the memory module;
   wherein the memory module is configured to partition itself into memory partitions in response to a second command from the particular host controller of the plurality of host controllers so that each memory partition corresponds to a respective one of the host controllers of the plurality of host controllers; and
   wherein each of a plurality of data input/output ports of the plurality of host controllers is configurable as at least one of an input and an output to correspond to a respective one of the input/output ports of the memory module.

2. The memory module of claim 1, wherein the memory-module controller is configured to configure a first number of the input/output ports of the memory module as inputs and a second number of the input/output ports of the memory module as outputs.

3. The memory module of claim 1, wherein the memory-module controller is configured to configure each of the plurality of data input/output ports of the memory module as at least one of an input and an output based on a data rate capacity per input/output port.

4. The memory module of claim 3, wherein the data rate capacity per input/output port of the memory module is stored on the memory module.

5. The memory module of claim 1, wherein the memory-module controller is configured to output data through input/output ports of the memory module configured as output ports and input data through input/output ports of the memory module configured as input ports concurrently and/or is configured to output data through input/output ports of the memory module configured as bidirectional input/outputs and input data through input/output ports of the memory module configured as bidirectional input/outputs concurrently.

6. The memory module of claim 1, wherein the memory module is configured to output configuration signals to a host controller of the plurality of host controllers from which an access command is received.

7. The memory module of claim 1, wherein the memory-module controller is configured to keep track of a number of times the one or more memory devices of the memory module have been programmed and read.

8. The memory module of claim 1, wherein the memory-module controller is configured to configure the input/output ports of the memory module so that a number of the input/output ports of the memory module configured as inputs is proportional to a number of write operations and a number of the input/output ports of the memory module configured as outputs is proportional to a number of read operations.

9. The memory module of claim 1, wherein the memory-module controller is configured to configure each of the plurality of data input/output ports of the memory module as at least one of an input and an output to maintain a power consumption of the memory module below a desired level.

10. The memory module of claim 1, further comprising a data register, wherein the memory-module controller is configured to store a number of times the one or more memory devices of the memory module have been programmed and read in the data register.

11. The memory module of claim 1, wherein the memory-module controller is configured to configure each of the plurality of data input/output ports of the memory module according to at least one operational attribute of the memory module.

12. A memory module, comprising:
one or more memory devices;
a memory-module controller in communication with the one or more memory devices; and
a plurality of input/output ports;
wherein the memory-module controller is configured to configure each of the input/output ports of the memory module as at least one of an input and an output in response to a first command originating from a particular host controller of a plurality of host controllers coupled to the memory module;
wherein the memory module is configured to partition itself into memory partitions in response to a second command originating from the particular host controller of the plurality of host controllers so that each memory partition corresponds to a respective one of the host controllers of the plurality of host controllers; and
wherein each of a plurality of data input/output ports of the plurality of host controllers is configurable as at least one of an input and an output to correspond to a respective one of the input/output ports of the memory module.

13. The memory module of claim 12, wherein the memory-module controller is configured to output configuration data to a host controller of the plurality of host controllers from which an access command is received.

14. The memory module of claim 12, wherein the memory-module controller is configured to configure a number of the data input/output ports of the memory module as at least one of an input and an output based on a number of times the one or more memory devices of the memory module have been programmed relative to a number of times the one or memory devices have been read.

15. The memory module of claim 12, further comprising a data register, wherein the memory-module controller is configured to store a number of times the one or more memory devices of the memory module have been programmed and read in the data register.

16. The memory module of claim 12, further comprising a data register, wherein the memory-module controller is configured to configure each of the plurality of data input/output ports of the memory module as at least one of an input and an output according to configuration data stored in the data register.

17. The memory module of claim 12, wherein the memory-module controller is configured to configure each of the plurality of data input/output ports of the memory module according to at least one operational attribute of the memory module.

18. The memory module of claim 12, wherein the memory-module controller is configured to configure each of the plurality of data input/output ports of the memory module as at least one of an input and an output to maintain a power consumption of the memory module below a desired level.

19. An electronic system, comprising:
a memory module comprising a plurality of data input/output ports;
a plurality controllers coupled in parallel to the memory module;
wherein the memory module is configured to configure each of the plurality of data input/output ports thereof as at least one of an input and an output in response to a first command from a particular controller of the plurality of controllers;
wherein the memory module is configured to partition itself into memory partitions in response to a second command from the particular controller of the plurality of controllers so that each memory partition corresponds to a respective one of the controllers of the plurality of controllers; and
wherein each of a plurality of data input/output ports of the plurality of controllers is configurable as at least one of an input and an output to correspond to a respective one of the input/output ports of the memory module.

20. The electronic system of claim 19, wherein the memory module is configured to configure each of the plurality of data input/output ports of the memory module as at least one of an input and an output based on a data rate capacity per input/output port.

21. The electronic system of claim 19, wherein the memory module is configured to output configuration data to a controller of the plurality of controllers from which an access command is received.

22. The electronic system of claim 19, wherein the memory module is configured to store a number of times the one or more memory devices of the memory module have been programmed and read on the memory module.

23. The electronic system of claim 19, wherein the memory module is configured to configure each of the plurality of data input/output ports of the memory module as at least one of an input and an output according to configuration data stored on the memory module.

24. The electronic system of claim 19, wherein the memory module is configured to configure a number of the data input/output ports of the memory module as at least one of an input and an output based on a number of times the one or more memory devices of the memory module have been programmed relative to a number of times the one or memory devices have been read.

25. The electronic system of claim 19,
wherein the memory module is configured to configure as inputs a first number of the plurality of data input/output ports of the memory module configured as at least one of an input and an output; and wherein the memory module is configured to configure as outputs a second number of the plurality of data input/output ports of the memory module configured as at least one of an input and an output;

wherein the first number is proportional to a number of times one or memory devices of the memory module have been programmed; and wherein the second number is proportional to a number of times the one or memory devices have been read.

26. An electronic system, comprising:
a memory module comprising plurality of data input/output ports;
a plurality controllers coupled to the memory module;
wherein the memory module is configured to configure each of the plurality of data input/output ports thereof as at least one of an input and an output in response to a first command originating from a particular controller of the plurality of controllers;
wherein the memory module is configured to partition itself into memory partitions in response to a second command originating from the particular controller of the plurality of controllers so that each memory partition corresponds to a respective one of the controllers of the plurality of controllers; and
wherein each of a plurality of data input/output ports of the plurality of controllers is configurable as at least one of an input and an output to correspond to a respective one of the input/output ports of the memory module.

27. The electronic system of claim 26, wherein the memory module is configured to configure each of the plurality of data input/output ports of the memory module as at least one of an input and an output based on a data rate capacity per input/output port.

28. The electronic system of claim 26, wherein the memory module is configured to output configuration signals to a controller of the plurality of controllers from which an access command is received.

29. The electronic system of claim 26, wherein the memory module is configured to keep track of a number of times one or more memory devices of the memory module have been programmed and read.

30. The electronic system of claim 26, wherein the memory module is configured to configure the input/output ports of the memory module so that a number of the input/output ports of the memory module configured as inputs is proportional to a number of times one or memory devices of the memory module have been programmed and a number of the input/output ports of the memory module configured as outputs is proportional to a number of times the one or memory devices have been read.

31. The electronic system of claim 26, wherein the memory module is configured to configure each of the plurality of data input/output ports of the memory module as at least one of an input and an output to maintain a power consumption of the memory module below a desired level.

32. The electronic system of claim 26, wherein the memory module is configured to configure each of the plurality of data input/output ports of the memory module according to at least one operational attribute of the memory module.

* * * * *

UNITED STATES PATENT AND TRADEMARK OFFICE
CERTIFICATE OF CORRECTION

PATENT NO. : 8,364,856 B2  
APPLICATION NO. : 13/445083  
DATED : January 29, 2013  
INVENTOR(S) : Terry R. Lee et al.

Page 1 of 1

It is certified that error appears in the above-identified patent and that said Letters Patent is hereby corrected as shown below:

In the Claims:

In column 11, line 61, in Claim 14, delete "one or" and insert -- one or more --, therefor.

In column 12, line 61, in Claim 24, delete "one or" and insert -- one or more --, therefor.

In column 13, line 6, in Claim 25, delete "one or" and insert -- one or more --, therefor.

In column 13, line 9, in Claim 25, delete "one or" and insert -- one or more --, therefor.

In column 14, line 16, in Claim 30, delete "one or" and insert -- one or more --, therefor.

In column 14, line 19, in Claim 30, delete "one or" and insert -- one or more --, therefor.

Signed and Sealed this  
Seventh Day of May, 2013

Teresa Stanek Rea  
*Acting Director of the United States Patent and Trademark Office*